United States Patent

Wu et al.

[11] Patent Number: 6,150,259
[45] Date of Patent: Nov. 21, 2000

[54] METHOD FOR FORMING A METAL PLUG

[75] Inventors: Kun-Lin Wu, Taichung; Horng-Bor Lu, Hsinchu, both of Taiwan

[73] Assignee: United Microelectronics Corp., Hsinchu, Taiwan

[21] Appl. No.: 09/191,162

[22] Filed: Nov. 13, 1998

[51] Int. Cl.[7] .................................................. H01L 21/4763
[52] U.S. Cl. ........................ 438/628; 438/631; 438/644; 438/648; 438/654; 438/656; 438/672; 438/683
[58] Field of Search ...................................... 428/628, 631, 428/644, 648, 654, 656, 672, 683

[56] References Cited

U.S. PATENT DOCUMENTS

| | | | |
|---|---|---|---|
| 5,094,977 | 3/1992 | Yu et al. | 437/174 |
| 5,834,068 | 11/1998 | Chern et al. | 427/535 |
| 5,970,378 | 10/1999 | Shue et al. | 438/656 |

*Primary Examiner*—John F. Niebling
*Assistant Examiner*—David A. Zarneke
*Attorney, Agent, or Firm*—Charles C.H. Wu; Charles C.H. Wu & Associates

[57] ABSTRACT

A method for forming a metal plug is provided. The method is used to form a metal plug without a hole on a glue/barrier layer within a trench when the glue/barrier layer has been formed for a while. A substrate with a trench therein and a glue/barrier layer formed conformal to the profile of the substrate is provided. A post-treatment is performed on the glue/barrier layer to prevent moisture absorption and to make the glue/barrier become dense. The post-treatment comprises a plasma treatment or a deep UV plus laser treatment. After performing the post-treatment step, a metal layer is formed on the glue/barrier layer at least to fill in the trench. The metal layer other than that filling the trench is removed to form a metal plug.

20 Claims, 3 Drawing Sheets

METHOD FOR FORMING A METAL PLUG

BACKGROUND OF THE INVENTION

1. Field of the Invention

The invention relates in general to the fabrication of semiconductor integrated circuits (ICs), and more particularly to a method for forming a metal plug with good step coverage.

2. Description of the Related Art

In general, the fabrication of metal plugs comprises steps of forming a trench opening in a dielectric layer and forming a metal material in the trench opening. Since adhesion between the metal and the dielectric layer is not ideal, a titanium/titanium nitride (Ti/TiN) layer used as a glue/barrier layer is often formed between the metal and the dielectric layer to enhance the adhesion. As the IC devices are continuously sized down to a line width of 0.25 µm, the trench opening has a large aspect ratio so that the glue/barrier layer is formed using chemical vapor deposition (CVD) with a better step coverage than other methods.

However, the structure of the glue/barrier layer formed on the bottom of the trench is worse than the glue/barrier layer formed on the sidewall of the trench. The worse structure means that grains of the glue/barrier layer are not uniform or that the glue/barrier layer is amorphous. The structure described above has a high resistance and decreases the adhesion for a metal layer formed in the trench during a following step. A plasma treatment comprising $H_2/N_2$ is performed at the surface of the glue/barrier layer after depositing the glue/barrier layer to enhance the adhesion.

FIGS. 1A–1C are schematic, cross-sectional views showing the conventional process of forming a metal plug. As shown in FIG. 1A, a substrate 101 having a first metal layer 104 formed thereon is provided. A dielectric layer 102 is deposited on the substrate 101 and defined to form a trench opening 103 that exposes the first metal layer 104. A titanium layer 105 is deposited conformal to the profile of the dielectric layer 102. A titanium nitride layer 106 is deposited on the titanium layer 105. The titanium layer 105 and the titanium nitride layer 106 are used as a glue/barrier layer. A $H_2/N_2$ plasma treatment is performed to make the titanium nitride layer 106 more tenacious.

The titanium nitride layer absorbs moisture easily. During device fabrication, a step may be performed after waiting a period of time after finishing the foregoing step according to actual conditions. For example, there may not be enough machines to perform the foregoing step on devices at the same time. If a metal plug is filled in the trench a while (about 2–24 hours) after the titanium nitride layer is formed, the titanium nitride layer is exposed to the air and absorbs moisture. After absorbing moisture, the titanium nitride layer becomes incohesive and has a higher resistance than a titanium nitride layer without moisture therein. As shown in FIG. 1B, the titanium nitride layer 106a absorbs moisture 107 from the air. This increases the resistance of the titanium nitride layer 106a and decreases the adhesion of the titanium nitride layer 106a.

In FIG. 1C, a tungsten layer (not shown) is formed on the titanium nitride layer 106a to fill the trench opening 103. The tungsten layer other than what is in the trench opening 103 is removed to form a tungsten plug 109 using the titanium nitride layer 106a as a etching stop layer. The tungsten layer has bad step coverage because of the adhesion of the titanium nitride layer 106a, so that the tungsten is deposited faster at the top portion of the trench 103 than at the bottom portion of the trench 103. A hole 110 forms within the tungsten plug 109 while depositing the tungsten plug 109 in the trench 103. The hole 110 decreases the performance of IC devices comprising the tungsten plug therein.

SUMMARY OF THE INVENTION

It is therefore an object of the invention to provide an improved method of forming a metal plug. The absorbing moisture phenomenon of the titanium nitride layer can be prevented to enhance the adhesion. The metal plug is formed without any hole therein to increase the process yield.

To achieve these and other advantaged and in accordance with the purpose of the invention, as embodied and broadly described herein, the invention provides a method for forming a metal plug. The method is used to form a metal plug with any hole on a glue/barrier layer within a trench while the glue/barrier layer have been formed for a while. A substrate with a trench therein on which a glue/barrier layer is formed conformal to the profile of the substrate is provided. A post-treatment is performed on the glue/barrier layer to prevent moisture absorption and to make the glue/barrier become dense. The post-treatment comprises a plasma treatment or a deep UV pulse laser treatment. After performing the post-treatment step, a metal layer is formed on the glue/barrier layer at least to fill in the trench. The metal layer other than that filling in the trench is removed to form a metal plug.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
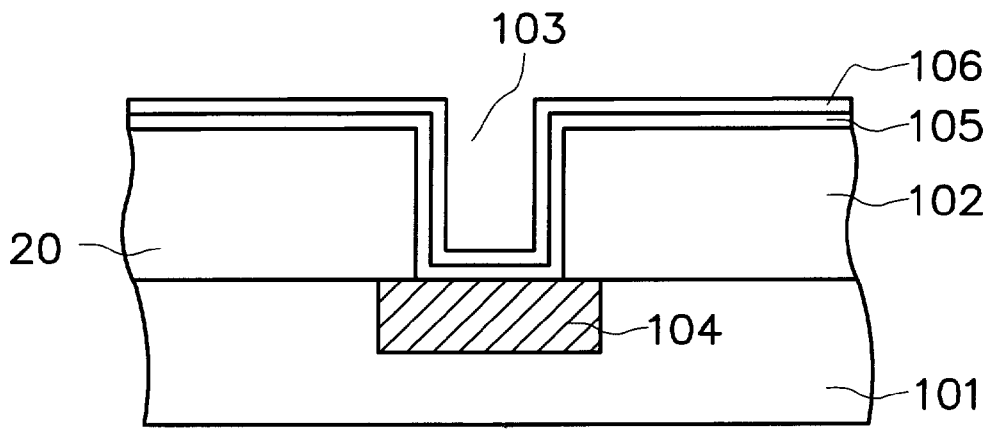
FIGS. 1A–1C are schematic, cross-sectional views showing the conventional process of forming a metal plug.
Figure 1B:
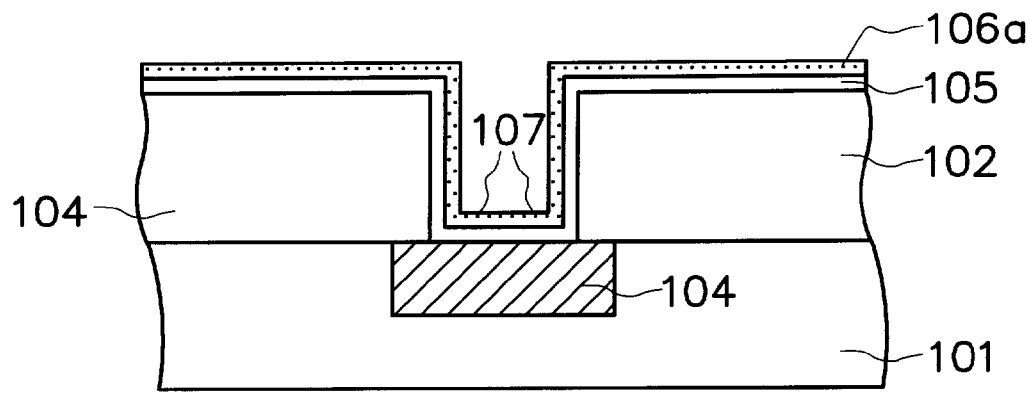
Figure 1C:
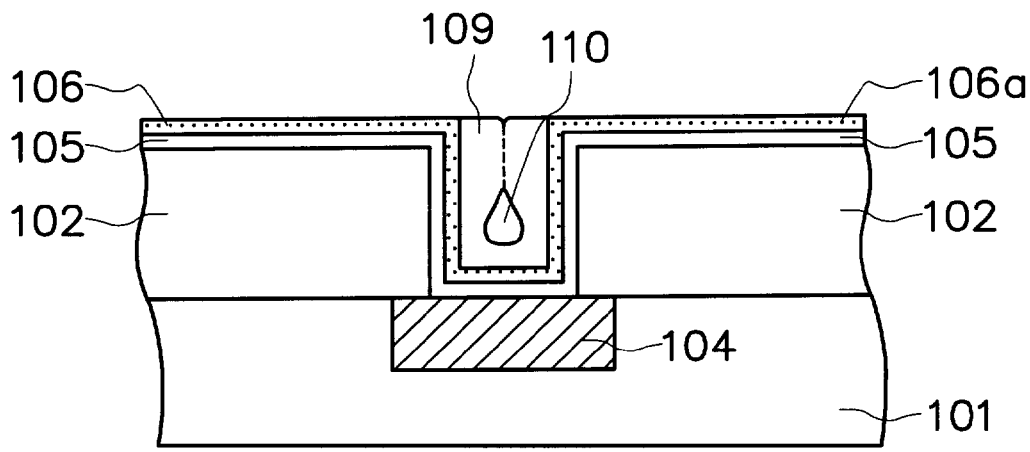
Figure 2A:
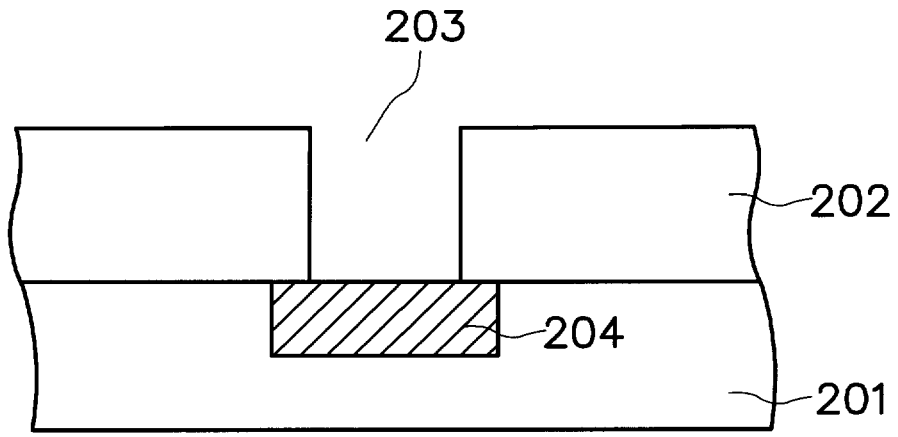
FIGS. 2A–2E are schematic, cross-sectional views showing the process for forming a metal plug according to one preferred embodiment of this invention.

In FIG. 2A, a substrate 201 having a conductive region 204 therein is provided. The conductive region 204 is, for example, a MOS transistor or a device with a metal layer thereon. A dielectric layer 202 is formed on the substrate 201. An opening 203, such as a trench or a contact, is formed in the dielectric layer 202 to expose the conductive region 204. The dielectric layer 202 comprises an oxide layer which is formed, for example, using TEOS as a source gas by plasma enhanced chemical vapor deposition (PECVD).

Figure 2B:
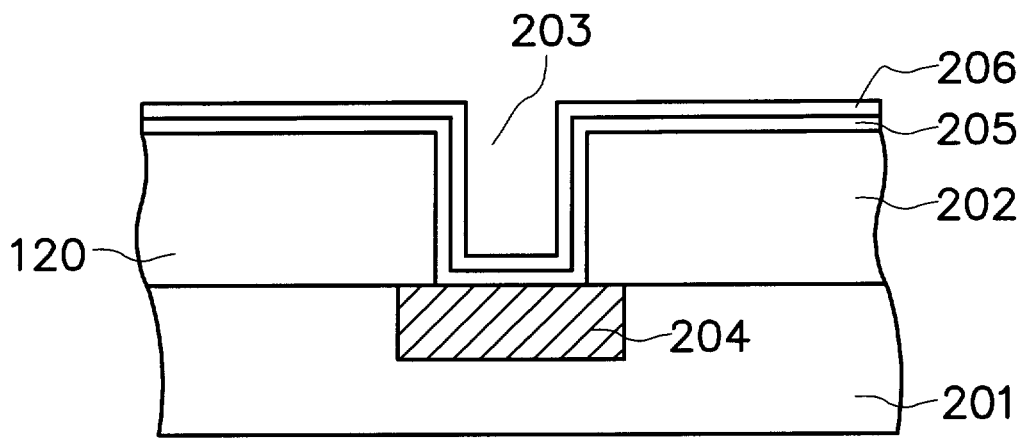

In FIG. 2B, a glue layer 205, such as a titanium layer, is formed along the profile of the dielectric layer 202. A barrier layer 206, such as a titanium nitride layer, is formed on the glue layer 205. A plasma treatment is performed at the barrier layer 206 to densify the barrier layer 206. The plasma treatment comprises nitrogen ($N_2$) and hydrogen ($H_2$).

Figure 2C:
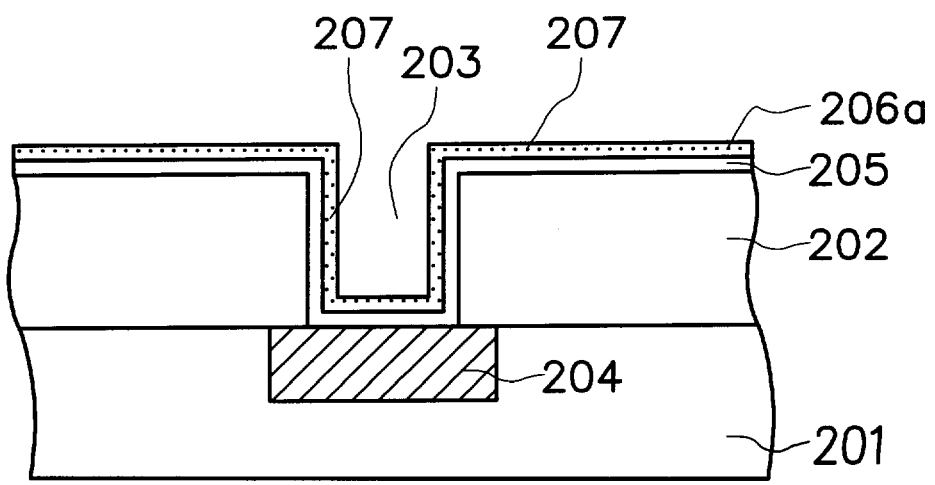

As shown in FIG. 2C, if the barrier layer 206a is exposed in air for a period of time of about 2–24 hours, the barrier layer 206a absorbs moisture 207. The adhesion of the barrier layer 206a decreases from absorbing moisture 207. Furthermore, the resistance of the barrier increases.

Figure 2D:
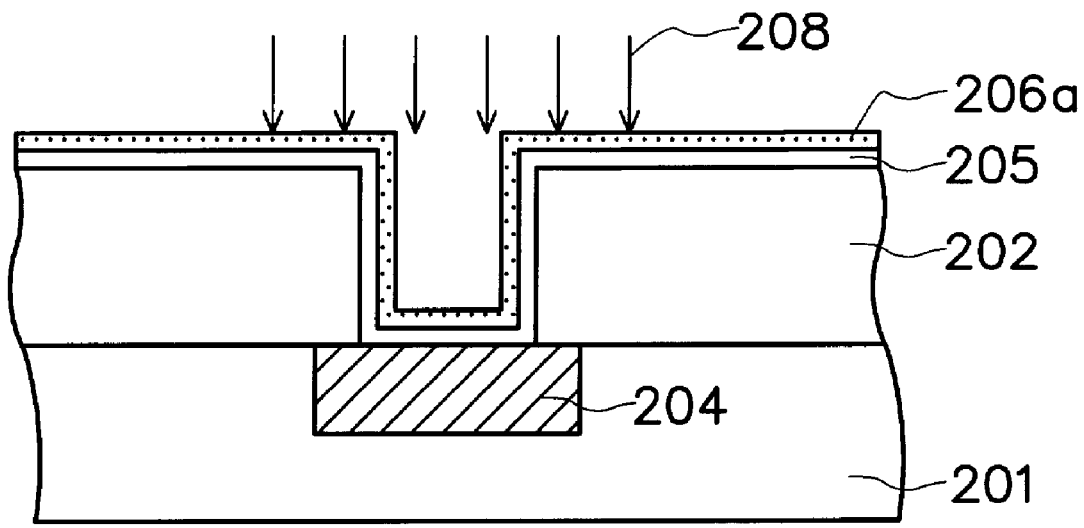

In FIG. 2D, after exposure in air for a period of time, a post-treatment step 208 is performed on the barrier layer 206a to densify the barrier layer 206a. The post-treatment step is performed using plasma or using a deep UV laser. The plasma, such as H$_2$/N$_2$ plasma has a power of about 50–1000 Watts, a flow velocity of about 100–2000 sccm and is performed for about 5–100 seconds. The deep UV laser, such as a pulse laser, has a wavelength shorter than about 365 nm with a power of about 5–1000 Watts and is performed about 1–50 times.

Figure 2E:
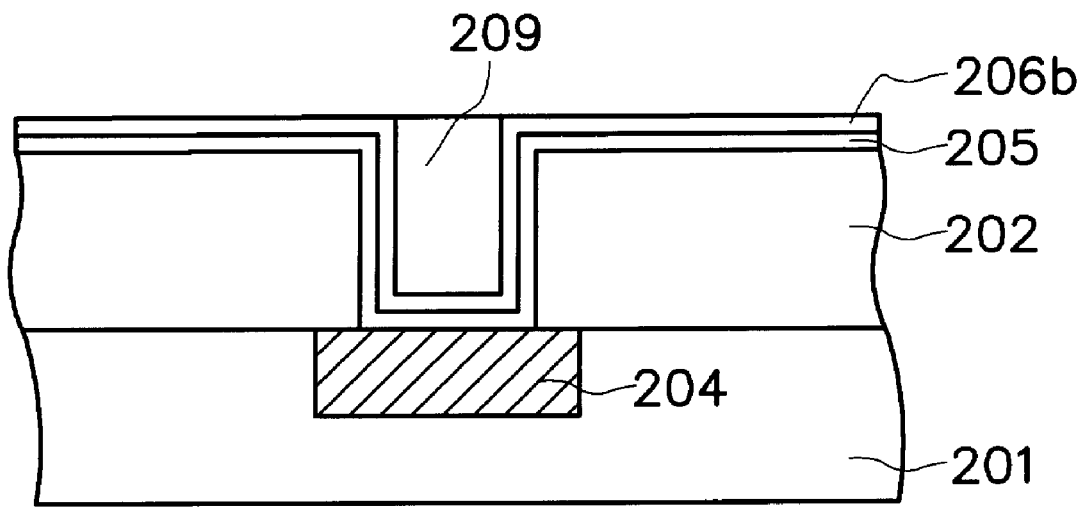

In FIG. 2E, after the post-treatment step, the barrier layer 206b becomes dense. A metal layer is formed on the barrier layer 206b at least to fill in the opening 203. The metal layer in the position other than in the trench 203 is removed to form a metal plug 209 within the trench 203. The metal plug comprises tungsten or aluminum. Since the barrier layer 206b has a better adhesion than a conventional barrier layer, the metal plug 209 is formed without any hole in the trench 203.

It is noticed that if the metal plug is not formed in the trench immediately after performing the post-treatment step, the barrier is still exposed in air. The post-treatment step must be performed again after a period of time before forming the metal plug to densify the barrier layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a metal plug, comprising the steps of:

providing a substrate comprising a trench therein and a titanium nitride layer formed along the profile of the substrate;

performing a plasma treatment to the titanium nitride layer;

performing a post-treatment comprising a plasma or a deep UV laser on the titanium nitride layer after exposing the titanium nitride layer in air for a period of time, so as to make the titanium nitride dense and to increase the adhesion of the titanium nitride layer for attaching a metal layer thereon in a subsequent step;

forming the metal layer on the titanium nitride layer at least to fill the trench;

removing a part of the metal layer other than that filling the trench.

2. The method according to claim 1, wherein the period of time is about 2–24 hours.

3. The method according to claim 1, wherein the plasma is used with a power of about 50–1000 Watts for about 5–100 seconds.

4. The method according to claim 3, wherein the plasma comprises H$_2$ and N$_2$.

5. The method according to claim 1, wherein the deep UV laser is used with a power of about 5–1000 Watts.

6. The method according to claim 5, wherein the deep UV laser is a pulse laser with a wavelength shorter than about 360 nm.

7. The method according to claim 5, wherein the deep UV laser is performed about 1–50 times.

8. The method according to claim 1, wherein the metal layer comprises an aluminum layer.

9. The method according to claim 1, wherein the metal layer comprises a tungsten layer.

10. A method for forming a metal layer is performed after a period of time while a glue/barrier layer has been formed on a substrate and exposed in air, the method comprising the steps of:

performing a plasma treatment on the glue/barrier layer;

performing a post-treatment on the glue/barrier layer after the plasma treatment;

forming the metal layer on the glue/barrier layer.

11. The method according to claim 10, wherein the glue/barrier layer comprises a titanium nitride layer.

12. The method according to claim 10, wherein the glue/barrier layer comprises a titanium layer and a titanium nitride layer.

13. The method according to claim 10, wherein the period of time is about 2–24 hours.

14. The method according to claim 10, wherein the post-treatment comprises using a plasma treatment with a power of about 50–1000 Watts for about 5–100 seconds.

15. The method according to claim 14, wherein the plasma treatment comprises H$_2$ and N$_2$.

16. The method according to claim 10, wherein the post-treatment comprises using a deep UV laser with a power of about 5–1000 Watts.

17. The method according to claim 16, wherein the deep UV laser is a pulse laser with a wavelength shorter than about 360 nm.

18. The method according to claim 16, wherein the deep UV laser is performed about 1–50 times.

19. The method according to claim 10, wherein the metal layer comprises an aluminum layer.

20. The method according to claim 10, wherein the metal layer comprises a tungsten layer.

* * * * *